United States Patent [19]
Buer et al.

[11] Patent Number: 5,949,312
[45] Date of Patent: Sep. 7, 1999

[54] SUSPENDED MONOLITHIC MICROWAVE INTEGRATED CIRCUIT AND METHOD OF MANUFACTURE

[75] Inventors: Kenneth Vern Buer; David Warren Corman, both of Gilbert; Deborah Sue Dendy, Tempe; James Roger Clark, II, Phoenix., all of Ariz.

[73] Assignee: Motorola, Inc., Schaumburg, Ill.

[21] Appl. No.: 08/961,234

[22] Filed: Oct. 30, 1997

[51] Int. Cl.⁶ ........................................ H01P 3/08
[52] U.S. Cl. ........................ 333/246; 333/247; 257/664
[58] Field of Search .................... 333/238, 246, 333/247, 204, 32; 257/664, 707

[56] References Cited

U.S. PATENT DOCUMENTS

| | | | |
|---|---|---|---|
| 4,394,633 | 7/1983 | Klein | 333/246 X |
| 4,525,680 | 6/1985 | Pan et al. | 330/294 X |
| 5,012,319 | 4/1991 | Dykaar et al. | 333/246 X |
| 5,157,364 | 10/1992 | Pond et al. | 333/246 X |
| 5,319,329 | 6/1994 | Shiau et al. | 333/238 X |
| 5,650,760 | 7/1997 | Degun et al. | 333/246 |

FOREIGN PATENT DOCUMENTS 06-326252  11/1994  Japan ........................................ 333/246

OTHER PUBLICATIONS

Y. Sun, et al., "Suspended Membrane Inductors and Capacitors for Application in Silicon MMIC's" IEEE 1996, Microwave and Millimeter–Wave Monolithic Circuits Symposium, pp. 99–102.

*Primary Examiner*—Robert Pascal
*Assistant Examiner*—Barbara Summons
*Attorney, Agent, or Firm*—Gregory J. Gorrie

[57] ABSTRACT

A MMIC for providing a suspended transmission medium, comprising a MMIC chip, an upper ground plane overlying and spaced from critical circuitry and a lower ground plane underlying and spaced from the critical circuitry. The upper and lower ground planes are spaced from the critical circuitry at electrically similar distances. The portion of the MMIC chip that has the critical circuitry is suspended over a recess in the housing floor.

22 Claims, 1 Drawing Sheet

SUSPENDED MONOLITHIC MICROWAVE INTEGRATED CIRCUIT AND METHOD OF MANUFACTURE

FIELD OF THE INVENTION

This invention relates generally to the field of microwave transmission systems and, more particularly, to a suspended monolithic microwave integrated circuit.

BACKGROUND OF THE INVENTION

It is well known that in many microwave applications, improved performance is achieved by minimizing losses in the transmission media. This is especially true for critical microwave system components like low noise amplifier (LNA) input matching circuits, power amplifier (PA) output matching circuits, power combiners, and high Q filters. In these critical applications, losses are the primary factor in achieving suitable performance.

It is also well known that Gallium Arsenide (GaAs), which is commonly used as a substrate for fabricating monolithic microwave integrated circuits (MMICs), has relatively high loss compared to other available microwave substrate materials. For this reason, in applications such as those mentioned above where minimizing loss is important, the critical circuit is fabricated on a lower loss substrate such as alumina or quartz, and then interconnected with the rest of the MMIC. For example, power amplifiers are often designed with off-chip output matching circuits. It is also known that even lower loss can be achieved by suspending the substrate away from top and bottom ground planes. This is known as suspended stripline transmission media. Suspended stripline is sometimes used in filters where higher Q is needed and in other critical applications.

At higher frequencies it becomes more difficult to fabricate a low loss transition between the MMIC and the off-chip circuitry. In addition, slight variations in such an interface add parasitic reactance to the circuit. At millimeter wave frequencies, this reactance can cause mismatches that degrade performance even more severely than the losses encountered by keeping the circuit on-chip. Even extensive manual tuning of the interface circuit may not improve the interface mismatch problem.

Therefore, what is needed is a method of improving circuit performance by reducing the loss of critical on-chip MMIC circuitry. What is also needed is a method of avoiding the reactive mismatch problem of high frequency transitions and improving MMIC circuit performance without tuning. Further needed is a method of achieving low loss on MMIC circuits compatible with existing MMIC fabrication processes.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

The present invention provides, among other things, a monolithic microwave integrated circuit (MMIC) for providing a suspended transmission medium, a method of reducing loss of critical MMIC circuitry and a method of manufacturing a suspended transmission medium in a MMIC chip. In a further and more specific aspect, the present invention provides a suspended MMIC circuit operative for providing a suspended stripline transmission medium on a chip operative for minimizing losses in a transmission media. The present invention has specific application in combination with critical microwave system components like low noise amplifier (LNA) input matching circuits, power amplifier (PA) output matching circuits, power combiners, and high Q filters.

Figure 1:
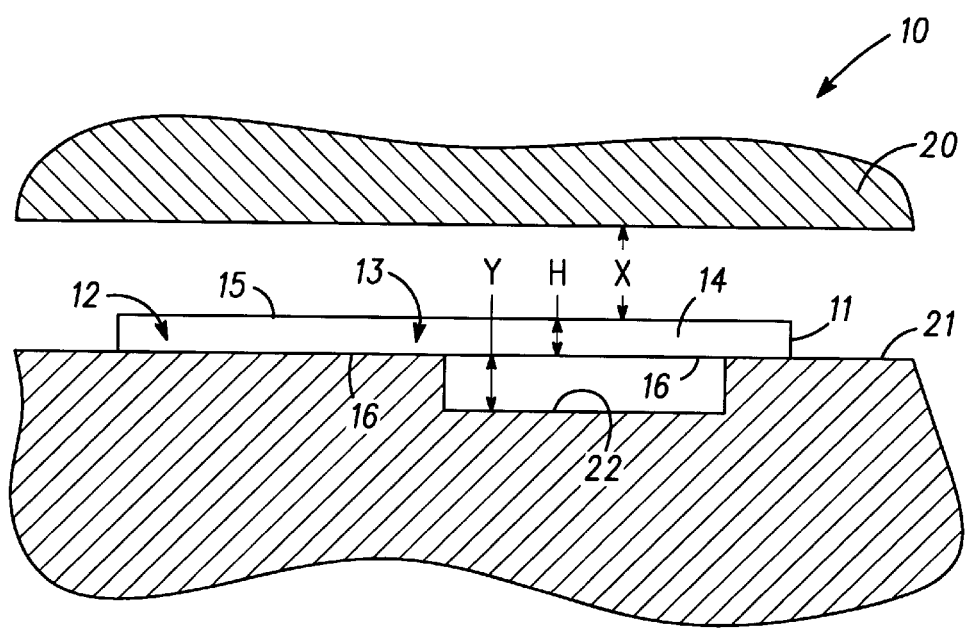
FIG. 1 illustrates a side view of a suspended MMIC circuit, in accordance with a preferred embodiment of the present invention.
Figure 2:
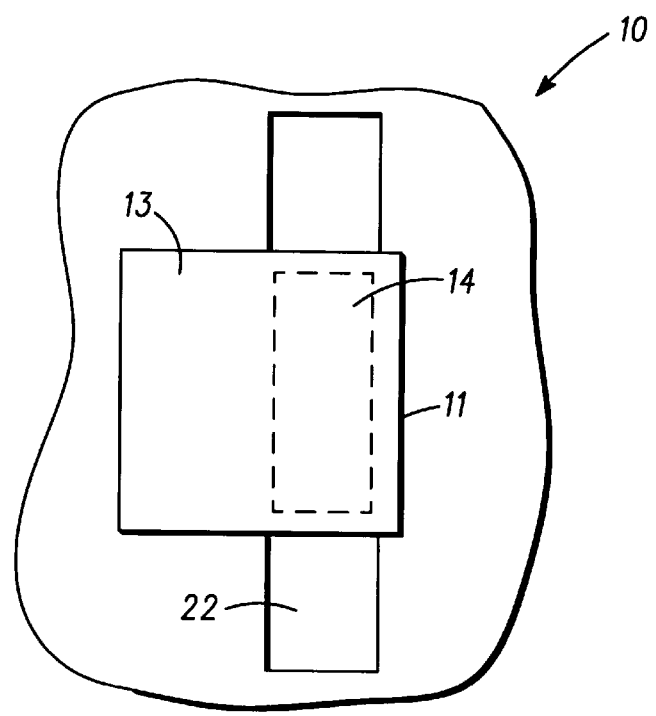
FIG. 2 illustrates a top view of the suspended MMIC circuit of FIG. 1, in accordance with a preferred embodiment of the present invention.

Consistent with the desired teachings of the present invention, FIG. 1 illustrates a side view of a suspended MMIC circuit generally designated at 10, in accordance with a preferred embodiment of the present invention. MMIC circuit 10 is generally comprised of a conventional and well-known MMIC chip 11. With additional reference to FIG. 2 illustrating a top view of the suspended MMIC circuit of FIG. 1, MMIC chip 11 is comprised of a substrate 12 having standard microstrip circuitry 13 and transmission circuitry, herein defined as critical circuitry 14. In accordance with conventional practice and as shown in FIG. 1, MMIC chip 11 further includes a topside ground plane 15 and an opposing backside ground plane 16.

In accordance with conventional practice, substrate 12 is normally constructed of Gallium Arsenide (GaAs), although this is not an essential feature and other suitable substrate materials may be used in accordance with conventional practice relating to the fabrication of MMIC chips. Suitable substrate materials may include Silicon and Indium-Phosphide. Furthermore, topside ground plane 15 and backside ground plane 16 may each be constructed of gold or other suitable conductive material having a preferred thickness of between 0.5 and 10.0 microns, although this is not essential and other suitable and/or equivalent structure may be used consistent with conventional practice, details of which will not be herein specifically addressed as they will readily occur to the skilled artisan. Critical circuitry 14 of MMIC chip 11 is herein further defined as circuitry for which loss is paramount.

Referring back to FIG. 1, MMIC circuit 10 further includes an upper ground plane 20 overlying and spaced from MMIC chip 11 and critical circuitry 14 a distance X. Also included is a lower ground plane 21 underlying and spaced from MMIC chip 11 and critical circuitry 14, upper and lower ground planes 20 and 21 preferably but not essentially residing in substantially parallel planes. Upper ground plane may be generally characterized as a housing wall of a housing (not shown). Furthermore, lower ground plane 21 may be generally characterized as a mounting surface or a housing floor of the housing upon which MMIC chip 11 may be mounted, further details to be discussed shortly. In accordance with preferred teachings, backside ground plane 16 is absent from MMIC chip 11 adjacent critical circuitry 14. Critical circuitry 14 is further shown positioned opposite a recess 22 (also shown in FIG. 2) formed into lower ground plane 21, recess 22 being spaced from critical circuitry 14 a distance Y as evidenced in FIG. 1.

From the foregoing physical description of MMIC circuit 10, critical circuitry 14 is essentially suspended over and coincides with recess 22 of lower ground plane 21 to define a suspended transmission medium of MMIC chip 11, recess 22 being operative as the lower ground plane. Upper ground plane 20 and recess 22 are preferably spaced from the critical circuitry at electrically similar distances. In a preferred embodiment, substrate 12 is constructed of GaAs. Due to the dielectric constant of GaAs, the distance X is preferably greater than distance Y with recess 22 being somewhat closer to critical circuitry 14 relative to upper ground plane 20 by an appropriate distance to achieve a desired characteristic impedance of critical circuitry 14. Distances X and Y may vary depending upon the dielectric constant of substrate 12. In this regard, although upper ground plane 20 is shown as substantially planar, a recess may be formed in upper ground plane 20 of a predetermined extent to achieve desired impedance. Regarding a preferred embodiment, the distances X and Y may be approximated by the equation:

$$X = Y + h * \sqrt{\epsilon_r}$$

where X=400 $\mu$m, Y=200 $\mu$m, h=50 $\mu$m and $\epsilon_r$=12.9.

Wherein "h" is the thickness of substrate 12 and $\epsilon_r$ is the dielectric constant of substrate 12.

To mount MMIC chip 11 and suspend critical circuitry 14 as herein discussed, epoxy or preferably solder may be placed upon the housing floor or lower ground plane 21. MMIC chip 11 may then be positioned on the lower ground plane 21 with the critical circuitry 14 aligned opposite recess 22 formed in lower ground plane 21. The solder, in accordance with a preferred method, may then be re-flowed causing the liquid surface tension of the solder to align the suspended portion, critical circuitry 14, of MMIC chip 11 with recess 22. This alignment takes place because the critical circuitry 14 portion of MMIC chip 11 has the backside ground plane 16 removed. Therefore, when the solder re-flows, it will wet only to the portions of MMIC chip 11 which contain backside ground plane 16, pulling critical circuitry 14 of MMIC chip 11 into exact alignment with recess 22, thus suspending the portion of MMIC chip 11 having critical circuitry 14.

The present invention reduces loss at critical circuitry 14. The problems of high frequency transition reactive mismatch is avoided, and improved MMIC circuit performance is achieved without tuning. The foregoing process of achieving low loss in critical circuitry 14 of MMIC chip 11 is also compatible with existing MMIC fabrication processes.

Furthermore, on-chip high-characteristic impedance transmission lines may be achieved by virtue of the present MMIC circuit 10. Typically, process limitations do not allow microstrip line widths of less than approximately 5 $\mu$m on-chip. This effectively sets an upper limit on the maximum characteristic impedance available. With critical circuitry 14 of MMIC chip 11 suspended in the exemplary manner herein specifically addressed, however, the distance to the upper and lower ground planes along with the line width determine the characteristic impedance. This opens up an additional range of higher impedance lines that can be realized on-chip with a suspended MMIC as herein described. Having a much higher range of characteristic impedance available is paramount in designing many matching and filtering circuits.

The present invention has been described above with reference to a preferred embodiment. However, those skilled in the art will recognize that changes and modifications may be made in the described embodiments without departing from the nature and scope of the present invention. Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

What is claimed is:

1. A suspended transmission device for providing a suspended transmission medium, comprising:

a MMIC chip;

an upper ground plane overlying and spaced from critical circuitry of the MMIC chip; and a lower ground plane underlying and spaced from the critical circuitry, the upper ground plane being spaced from the critical circuitry a distance somewhat greater than the lower ground plane.

2. The suspended transmission device of claim 1, wherein the upper ground plane is comprised of a housing wall.

3. The suspended transmission device of claim 1, wherein the lower ground plane is comprised of a housing floor.

4. The suspended transmission device of claim 1, wherein the upper and lower ground planes are spaced from the critical circuitry at distances operative to provide a desired and predetermined impedance.

5. The suspended transmission device of claim 1, wherein the MMIC chip further includes a backside ground plane mounted with a housing floor, the backside ground plane being absent from the MMIC chip adjacent the critical circuitry, the housing floor serving as the lower ground plane.

6. The suspended transmission device of claim 5, wherein the lower ground plane further includes a recess formed in the housing floor coinciding with the critical circuitry.

7. A method of reducing loss in MMIC circuitry, said method comprising the steps of:

providing a MMIC chip having critical circuitry;

providing an upper ground plane;

positioning the upper ground plane overlying and spaced from the critical circuitry;

providing a lower ground plane; and positioning the lower ground plane underlying and spaced from the critical circuitry, wherein the positioning the upper ground plane step comprises the step of positioning the upper ground plane spaced from the critical circuitry a distance somewhat greater than the lower ground plane is spaced from the critical circuitry.

8. The method of claim 7, wherein the step of providing a MMIC chip further includes the step of providing a MMIC chip having a backside ground plane, the backside ground plane being absent from the MMIC chip adjacent the critical circuitry.

9. The method of claim 8, wherein the steps of providing the lower ground plane and positioning the lower ground plane underlying and spaced from the critical circuitry further include the steps of:

providing a housing floor; and mounting the backside ground plane with the housing floor with portions of the housing floor coinciding with the critical circuitry being operative as the lower ground plane.

10. The method of claim 8, wherein the steps of providing the lower ground plane and positioning the lower ground plane underlying and spaced from the critical circuitry further include the steps of:

providing a housing floor having a recess; and mounting the backside ground plane with the housing floor with the recess coinciding with the critical circuitry and operative as the lower ground plane.

11. The method of claim 7, wherein the step of providing an upper ground plane further includes the step of providing a housing wall.

12. The method of claim 7, wherein the step of providing a lower ground plane further includes the step of providing a housing floor.

13. The method of claim 7, wherein the steps of positioning the upper ground plane and positioning the lower ground plane further include the step of spacing the upper and lower ground planes from the critical circuitry at distances operative for providing a desired and predetermined impedance.

14. A method of manufacturing a transmission medium, the method comprising the steps of:

provideng a MMIC chip having critical transmission circuitry;

mounting an upper ground plane overlying and spaced from the critical circuitry; and mounting a lower ground plane underlying and spaced from the critical circuitry, wherein the mounting the upper ground plane step further comprises the step of mounting the upper ground plane spaced from the critical circuitry a distance somewhat greater than the lower ground plane is spaced from the critical circuitry.

15. The method of claim 14, wherein the steps of mounting the upper ground plane and mounting the lower ground plane further include the step of spacing the upper and lower ground planes from the critical circuitry at distances operative for providing a desired and predetermined impedance.

16. The method of claim 14, wherein the step of mounting an upper ground plane overlying and spaced from the critical circuitry further include the step of mounting a housing wall overlying and spaced from the critical circuitry.

17. The method of claim 14, wherein the step of mounting a lower ground plane underlying and spaced from the critical circuitry further include the step of mounting a housing floor underlying and spaced from the critical circuitry.

18. The method of claim 14, wherein the step of providing a MMIC chip further includes the step of providing a MMIC chip having a backside ground plane, the backside ground plane being absent from the MMIC chip adjacent the critical circuitry.

19. The method of claim 18, wherein the step of mounting the lower ground plane underlying and spaced from the critical circuitry further include the steps of:

providing a housing floor;

forming a recess in the housing floor; and mounting the backside ground plane with the housing floor with the recess coinciding with the critical circuitry and operative as the lower ground plane.

20. The method of claim 19, wherein the step of mounting the backside ground plane with the housing floor further includes the step of aligning the critical circuitry with the recess.

21. The method of claim 20, wherein said step of aligning the critical circuitry with the recess further includes the steps of:

placing solder paste on the housing floor;

positioning the MMIC chip on the housing floor with the critical circuitry substantially adjacent the recess; and re-flowing the solder paste to align the critical circuitry with the recess in the housing floor.

22. The method of claim 18, wherein the step of mounting the lower ground plane underlying and spaced from the critical circuitry further includes the steps of:

providing a housing floor; and mounting the backside ground plane with the housing floor with portions of the housing floor coinciding with the critical circuitry being operative as the lower ground plane.

* * * * *